United States Patent
Hortaleza et al.

(10) Patent No.: US 6,657,311 B1
(45) Date of Patent: Dec. 2, 2003

(54) HEAT DISSIPATING FLIP-CHIP BALL GRID ARRAY

(75) Inventors: Edgardo R. Hortaleza, Garland, TX (US); Orlando F. Torres, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/147,094

(22) Filed: May 16, 2002

(51) Int. Cl.[7] .................... H01L 7/20; H01L 23/48; H01L 23/053; H01L 21/44; H01L 23/52
(52) U.S. Cl. .................. 257/778; 257/734; 257/737; 257/738; 257/668; 257/712; 257/698; 257/700; 257/701; 257/707; 257/713; 257/758; 257/786; 438/127; 438/107; 438/118; 438/612; 361/708; 361/719; 361/720; 361/704
(58) Field of Search ................... 257/778, 779, 257/777, 788, 712, 713, 717, 720, 675, 672, 737, 738, 734, 700, 701, 758, 707, 498, 668; 438/177, 107, 118, 612; 361/708, 719, 700, 783, 760, 767, 704

(56) References Cited

U.S. PATENT DOCUMENTS

| | | | | |
|---|---|---|---|---|
| 6,060,775 A | | 5/2000 | Ano ........................ | 257/673 |
| 6,084,308 A | * | 7/2000 | Kelkar et al. .............. | 257/777 |
| 6,087,717 A | | 7/2000 | Ano et al. ................. | 257/684 |
| 6,122,171 A | * | 9/2000 | Akram et al. .............. | 257/706 |
| 6,255,143 B1 | * | 7/2001 | Briar ......................... | 438/107 |
| 6,331,447 B1 | | 12/2001 | Ho ............................ | 438/128 |
| 6,339,254 B1 | * | 1/2002 | Venkateshwaran et al. . | 257/686 |
| 6,369,443 B1 | * | 4/2002 | Baba ......................... | 257/700 |
| 6,437,990 B1 | * | 8/2002 | Degani et al. .............. | 257/778 |
| 6,469,381 B1 | * | 10/2002 | Houle et al. ................ | 257/707 |
| 6,479,321 B2 | * | 11/2002 | Wang et al. ................. | 438/109 |
| 6,552,907 B1 | * | 4/2003 | Caldwell .................... | 361/708 |
| 2001/0003656 A1 | * | 6/2001 | Funaya et al. ............... | 438/1 |
| 2001/0054758 A1 | * | 12/2001 | Isaak .......................... | 257/686 |
| 2002/0011668 A1 | * | 1/2002 | Shishido et al. ............ | 257/747 |
| 2002/0038704 A1 | * | 4/2002 | Houle et al. ................ | 165/185 |
| 2002/0079575 A1 | * | 6/2002 | Hozoji et al. ............... | 257/734 |
| 2002/0130422 A1 | * | 9/2002 | Venkateshwaran .......... | 257/778 |
| 2002/0137255 A1 | * | 9/2002 | Wang et al. ................. | 438/107 |

OTHER PUBLICATIONS

Bindra, Ashok; BGA MOSFETsa Keep Their Cool At High Power Levels; Sep. 20, 1999; pp. 1–3.
Fujitsu Microelectronics Europe; ASIC Packaging; Mar. 5, 2002; pp. 1–5.
Fujitsu; ASIC Packaging; 4/00; pp. 1–4.

* cited by examiner

*Primary Examiner*—Alexander O. Williams
(74) *Attorney, Agent, or Firm*—Michael K. Skrehot; Wade James Brady, III; Frederick J. Telecky, Jr.

(57) ABSTRACT

A heat dissipating flip-chip Ball Grid Array (BGA) (10) including a substrate (12), a die (14), a first set of solder balls (16) coupling the die with the substrate, a thermal compound (20) attached to a backside of the die, a second set of solder balls (28) attached to the substrate, and a printed circuit board (22) that includes a heat dissipating metal (24). The heat dissipating metal is in contact with the thermal compound, and the second set of solder balls is connected to thermal vias in the printed circuit board.

30 Claims, 2 Drawing Sheets

HEAT DISSIPATING FLIP-CHIP BALL GRID ARRAY

FIELD OF THE INVENTION

The present invention relates to flip-chip ball grid arrays and, more particularly, to a heat dissipating flip-chip ball grid array.

BACKGROUND OF THE INVENTION

Flip chip assembly involves the direct electrical connection of face-down electronic components onto substrates or circuit boards by means of conductive bumps on the chip bond pads. By contrast, wire bonding uses face-up chips with a wire connection to each pad. There are three primary stages in making flip chip assemblies: bumping the die or wafer, attaching the bumped die to the board or substrate, and, in most cases, filling the remaining space under the die with an electrically non-conductive material. The bump serves several functions in the flip chip assembly. Electrically, the bump provides the conductive path from chip to substrate. The bump also provides a thermally conductive path to carry heat from the chip to the substrate. In addition, the bump, provides part of the mechanical mounting of the die to the substrate. Finally, the bump provides a space, preventing electrical contact between the chip and substrate. In the final stage of assembly, this space is usually filled with a non-conductive "underfill" adhesive joining the entire surface of the chip to the substrate. The underfill protects the bumps from moisture or other environmental hazards, provides additional mechanical strength to the assembly, and compensates for any thermal expansion difference between the chip and the substrate. Underfill mechanically "locks together" chip and substrate so that differences in thermal expansion do not break or damage the electrical connection of the bumps.

A Ball Grid Array (BGA) package is primarily composed of three basic parts: the bare chip, a BGA substrate, and an interconnection matrix. The flip-chip is connected to the BGA substrate face-down, while the interconnection matrix connects the bare chip to the BGA substrate using direct attach flip-chip style connections. The BGA substrate, which includes very small traces and vias, conveys signals to the underlying printed circuit board through the solder-bump attachment pads on its bottom surface. A metal cover or plastic encapsulation is then used to seal the package.

One of the problems facing flip-chip devices is the heat that is formed during use of the devices and as a result of power consumption. If the flip-chip device is heated above a certain threshold, the speed, performance, and lifetime of the device may be adversely affected. To aid in the removal of such heat, some packages incorporate a heat spreader which ensures safe operation of the device by efficiently diffusing the released heat and preventing over heating of the chip.

Utilizing a heat spreader, however, has various limitations. For example, an interface layer is added between the die and the heat spreader and a second interface is placed between the heat spreader and the heat sink. With the small package and die sizes involved, these interface layers are not very efficient, thus limiting the amount of heat that can be removed efficiently from the back of a package or chip. Other limitations include the limited area of dissipation and the cost associated with a heat spreader. As such, a larger area of dissipation at a lower cost would be very advantageous.

It is therefore desirable for the present invention to overcome the limitations described above that are involved in dissipating heat from flip-chip packages.

SUMMARY OF THE INVENTION

The present invention achieves technical advantages as a heat dissipating flip-chip Ball Grid Array (BGA) including additional structure that dissipates heat from the flip-chip to a supporting structure, such as a printed circuit board.

In one embodiment, a flip-chip ball grid array comprises a substrate, a die, a first set of solder balls adapted to couple the die with the substrate, a thermal compound adapted to couple to a backside of the die, a second set of solder balls adapted to couple with the substrate, and a printed circuit board comprising a heat dissipating metal, wherein the heat dissipating metal is adapted to couple with the thermal compound, and wherein the second set of solder balls is adapted to couple with the printed circuit board.

In another embodiment, a flip-chip ball grid array comprises a substrate, a die comprising a plated backside, a plurality of solder bumps adapted to couple the die to the substrate, a heat dissipating metal adapted to couple to the plated backside of the die, a plurality of solder balls adapted to couple to the substrate, and a multi-layer printed circuit board adapted to couple to the heat dissipating metal and to the plurality of solder balls.

In a further embodiment, a flip-chip ball grid array comprises a substrate, a die, a first set of solder balls adapted to couple the die to the substrate, a thermal compound adapted to couple to a backside of the die, a second set of solder balls adapted to couple to the substrate, and a multi-layer printed circuit board comprising: a heat dissipating metal, comprising thermal vias, adapted to couple to the thermal compound, and thermal vias adapted to couple to the second set of solder balls.

DETAILED DESCRIPTION OF THE INVENTION

Figure 1:
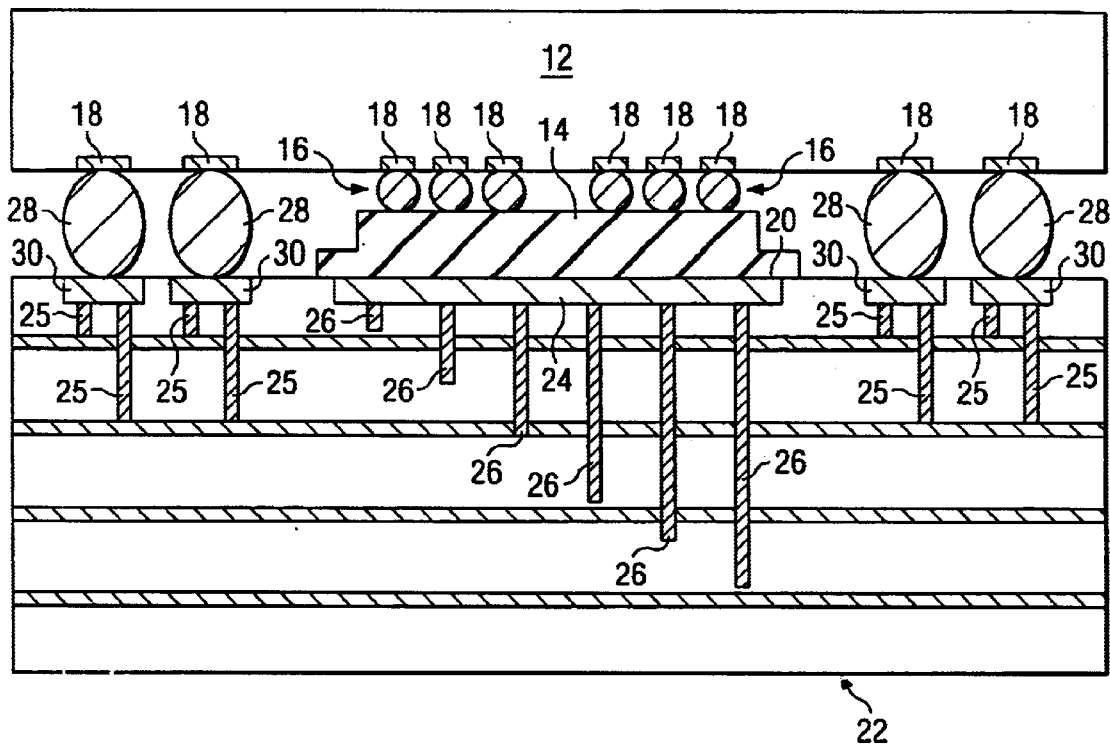
FIG. 1 illustrates a heat dissipating flip-chip Ball Grid Array in accordance with an exemplary embodiment of the present invention.

Referring now to FIG. 1, a flip-chip Ball Grid Array (BGA) 10 is presented which includes a substrate 12, a die 14, solder bumps (or a first set of solder balls) 16, solder pads (bump pads and/or BGA pads) 18, a thermal compound 20, a printed circuit board 22, a heat dissipating metal 24, vias 26, solder balls (or a second set of solder balls) 28, and BGA pads 30.

In one embodiment, the first set of solder balls 16 (or ball bumps) are adapted to couple the die 14 and the substrate 12, while the second set of solder balls 28 are adapted to couple with the printed circuit board 22 to the substrate 12. The first set of solder balls 16 and the second set of solder balls 28 are adapted to be coupled with the substrate 12 via the solder pads 18. The second set of solder balls 28 are adapted to be coupled with the printed circuit board 22 via solder pads and/or BGA pads 30. The thermal compound 20 (such as, for example, silicon grease) is adapted to couple with a backside of the die 14 and with the heat dissipating metal 24 (such as, for example, a copper pad) of the printed circuit board 22. The printed circuit board 22 and/or the heat dissipating metal 24 further comprise thermal vias. The thermal vias 25 of the printed circuit board 22 and the thermal vias 26 of the heat dissipating metal 24 are utilized to allow heat to dissipate from the die 14 through the printed circuit board. The printed circuit board thermal vias 25 are adapted to couple to the second set of solder balls 28. As such, heat may dissipate from the flip-chip BGA 10, through the thermal vias, the second set of solder balls 28, and the heat dissipating metal 24. The heat dissipating metal 24 may be located on a select area(s) of the printed circuit board 22 or on an entire area of the printed circuit board that is adapted to couple to the thermal compound 20. Underfill (not shown) is adapted to be placed between the die 14 and the substrate 12.

In another embodiment, the flip-chip ball grid array 10 comprises a substrate 12, a die 14 comprising a plated backside (not shown), and a plurality of solder bumps 16 adapted to couple the die 14 and the substrate 12. The plated portion, coupled with the backside of the die 14 comprises, for example, gold, copper, nickel, palladium, and/or any solderable material. A heat dissipating metal 24 is adapted to couple with the plated backside of the die 14 and a plurality of solder balls 28 are adapted to couple with the substrate 12. A multi-layer printed circuit board 22 is then adapted to couple with the heat dissipating metal 24 and with the plurality of solder balls.

The layers of the printed circuit board 22 comprise, for example, copper foils. The layers are of varying depths within the printed circuit board 22 and are adapted to couple with the plurality of solder balls 28 via the thermal vias 25 of the printed circuit board. The various layers may represent, for example, the core, inputs, outputs, etc. of the printed circuit board 22. Similarly, the heat dissipating metal 24 thermal vias 26 are adapted to couple the copper foil layers with the heat dissipating metal. As such, heat can be dissipated from the flip-chip BGA through the thermal vias coupled to the plurality of layers of the printed circuit board 22.

In a further embodiment, a flip-chip ball grid array 10 comprises a substrate 12, a die 14, a first set of solder balls 16 adapted to couple the die and the substrate, a thermal compound 20 adapted to couple with a backside (not shown) of the die 14, a second set of solder balls 28 adapted to couple with the substrate 12, and a multi-layer printed circuit board 22. The board 22 comprises a heat dissipating metal 24, comprising thermal vias 26, adapted to couple with the thermal compound 20, and further comprises thermal vias 25 adapted to couple with the second set of solder balls 28. The heat dissipating metal 24 thermal vias 26 and the multi-layer printed circuit board 22 thermal vias 25 are coupled with a plurality of the printed circuit board layers and are adapted to dissipate heat through the printed circuit board. The heat from the flip-chip BGA 10 is dissipated through at least one of the following items: the heat dissipating metal 24, the thermal compound 20, the die 14, the first set of solder balls 16, and the second set of solder balls 28.

Figure 2:
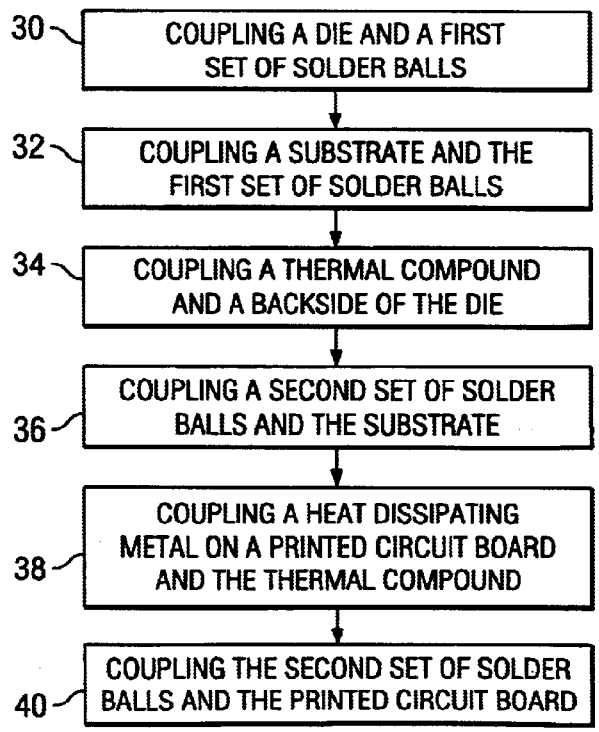
FIG. 2 illustrates a flow chart for producing a flip-chip Ball Grid Array in accordance with an exemplary embodiment of the present invention.

Referring now to FIG. 2, a method for producing a flip-chip ball grid array is presented. The method begins by coupling a die and a first set of solder balls at step 30, coupling a substrate and the first set of solder balls at step 32, and coupling a thermal compound and a backside of the die at step 34. The method proceeds to coupling a second set of solder balls and the substrate at step 36, coupling a heat dissipating metal on a printed circuit board and the thermal compound; at step 38, and coupling the second set of solder balls and the printed circuit board at step 40.

Figure 3:
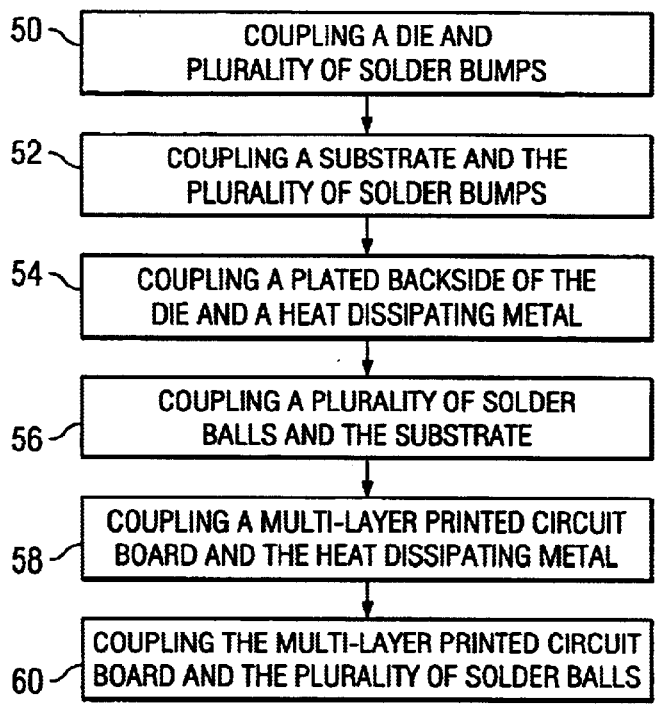
FIG. 3 illustrates another flow chart for producing a flip-chip Ball Grid Array in accordance with an exemplary embodiment of the present invention.

Referring now to FIG. 3, another method for producing a flip-chip ball grid array is presented. The method begins by coupling a die and a plurality of solder bumps at step 50, coupling a substrate and the plurality of solder bumps at step 52, and coupling a plated backside of the die and a heat dissipating metal at step 54. The method proceeds to coupling a plurality of solder balls and the substrate at step 56, coupling a multi-layer printed circuit board and the heat dissipating metal at step 58, and coupling the multi-layer printed circuit board and the plurality of solder balls at step 60.

Figure 4:
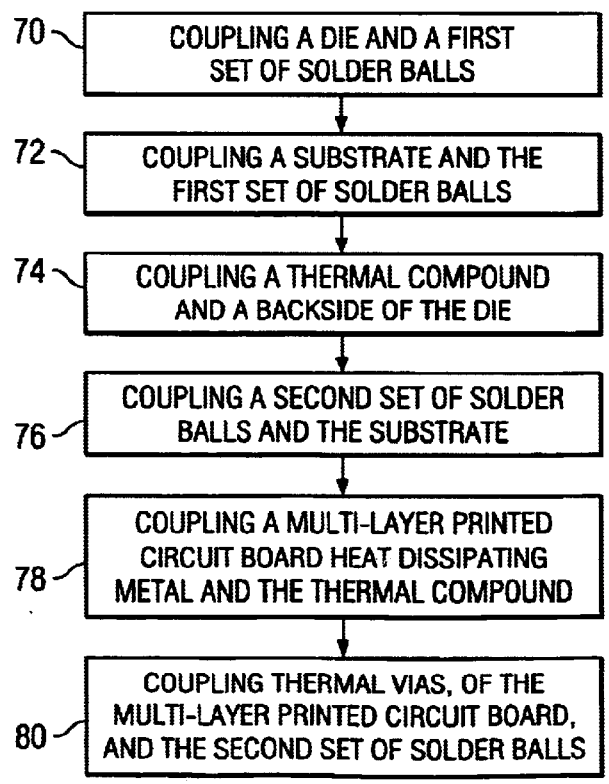
FIG. 4 illustrates a further flow chart for producing a flip-chip Ball Grid Array in accordance with an exemplary embodiment of the present invention.

Referring now to FIG. 4, another method for producing a flip-chip ball grid array is presented. The method begins by coupling a die and a first set of solder balls at step 70, coupling a substrate and the first set of solder balls at step 72, and coupling a thermal compound and a backside of the die at step 74. The method proceeds to coupling a second set of solder balls and the substrate at step 76, coupling a multi-layer printed circuit board heat dissipating metal and the thermal compound at step 78, and coupling thermal vias, of the multi-layer printed circuit board, and the second set of solder balls at step 80.

Although an exemplary embodiment of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims. For example, the flip-chip may be affixed to the BGA substrate either face-up or face-down. Also, the interconnection matrix may connects the bare chip to the BGA substrate using wire-bond, tape-automated-bonding, or direct attach flip-chip style connections. Still further, the thermal compound 20 and the heat dissipating metal 24 may cover a lesser and/or greater area than depicted in FIG. 1. Also, the number of printed circuit board vias, heat dissipating metal vias 26, the first set of solder balls 16, and the second set of solder balls 28 may be a lesser and/or greater number than depicted in FIG. 1. Also, the heat dissipating metal may not include any thermal vias.

What we claim is:

1. A flip-chip ball grid array, comprising:
   a substrate;
   a die;
   a first set of solder balls coupling the die and the substrate;
   a thermal compound in contact with a backside of the die;
   a second set of solder balls attached to the substrate; and
   a printed circuit board comprising a heat dissipating metal, wherein the heat dissipating metal is in contact with the thermal compound, and wherein the second set of solder balls is in contact with thermal vias in the printed circuit board.

2. The flip-chip ball grid array of claim 1, wherein the heat dissipating metal further comprises thermal vias.

3. The flip-chip ball grid array of claim 1, wherein the heat dissipating metal is in contact with the thermal compound in only select areas of a portion of the printed circuit board.

4. The flip-chip ball grid array of claim 1, wherein the heat dissipating metal is in contact with the thermal compound in an entire area of a portion of the printed circuit board.

5. The flip-chip ball grid array of claim 1, wherein the first set of solder balls and the second set of solder balls are attached to the substrate via solder pads.

6. The flip-chip ball grid array of claim 1, wherein the second set of solder balls are attached to the printed circuit board via BGA pads.

7. The flip-chip ball grid array of claim 1, wherein the second set of solder balls are attached to the printed circuit board via solder pads.

8. The flip-chip ball grid array of claim 1, wherein the first set of solder balls are solder bumps.

9. The flip-chip ball grid array of claim 1, wherein the first set of solder balls are ball bumps.

10. The flip-chip ball grid array of claim 1, wherein the thermal compound is silicon grease.

11. The flip-chip ball grid array of claim 1, wherein the heat dissipating metal is a copper pad.

12. The flip-chip ball grid array of claim 1, further comprising underfill between the die and the substrate.

13. A flip-chip ball grid array, comprising:
    a substrate;
    a die comprising a plated backside;
    a plurality of solder bumps coupling the die and the substrate;
    a heat dissipating metal attached to the plated backside of the die;
    a plurality of solder balls attached to the substrate;
    a multi-layer printed circuit board attached to the heat dissipating metal and attached to the plurality of solder balls, wherein at least one of the layers in said printed circuit board comprises a copper foil; and wherein said printed circuit board comprises thermal vias coupling said copper foil with said plurality of solder balls.

14. The flip-chip ball grid array of claim 13 further comprising thermal vias coupling the copper foils with the heat dissipating metal.

15. The flip-chip ball grid array of claim 13 wherein the plated portion of the die comprises gold.

16. The flip-chip ball grid array of claim 13 wherein the plated portion of the die comprises copper.

17. The flip-chip ball grid array of claim 13 wherein the plated portion of the die comprises nickel.

18. The flip-chip ball grid array of claim 13 wherein the plated portion of the die comprises palladium.

19. The flip-chip ball grid array of claim 13 wherein the plated portion of the die comprises a solderable material.

20. A flip-chip ball grid array, comprising:
    a substrate;
    a die;
    first set of solder balls coupling the die and the substrate;
    a thermal compound in contact with a backside of the die;
    a second seat of solder balls attached to the substrate; and
    a multi-layer printed circuit board comprising:
        a heat dissipating metal, comprising thermal vias, in contact with the thermal compound; and
        thermal vias coupled to the second set of solder balls.

21. The flip-chip ball grid array of claim 20 wherein the heat dissipating metal thermal vias and the multi-layer printed circuit board thermal vias originate at a plurality of the printed circuit board layers.

22. The flip-chip ball grid array of claim 21 wherein the heat dissipating metal thermal vias and the multi-layer printed circuit board thermal vias dissipate heat through the printed circuit board.

23. The flip-chip ball grid array of claim 22 structured such that the heat is dissipated through the heat dissipating metal.

24. The flip-chip ball grid array of claim 22 structured such that the heat is dissipated through the thermal compound.

25. The flip-chip ball grid array of claim 22 structured such that the heat is dissipated through the die.

26. The flip-chip ball grid array of claim 22 structured such that the heat is dissipated through the first set of solder balls.

27. The flip-chip ball grid array of claim 20 structured such that the heat is dissipated through the second set of solder balls.

28. A method for producing a flip-chip ball grid array, comprising:
    coupling a die and a first set of solder balls;
    coupling a substrate and the first set of solders balls;
    coupling a second set of solder balls and the substrate;
    coupling a heat dissipating metal on a printed circuit board and the thermal compound;
    coupling a backside of the die to the heat dissipating metal with thermal compound; and
    coupling the second set of solder balls and thermal vias in the printed circuit board.

29. A method for producing a flip-chip ball grid array, comprising:
    coupling a die and a plurality of solder bumps;
    coupling a substrate and the plurality of solder bumps;
    coupling a plated backside of the die and a heat dissipating metal;
    coupling a plurality of solder balls and the substrate;
    coupling a multi-layer printed circuit board and the heat dissipating metal; and
    coupling thermal vias in the multi-layer printed circuit board to the plurality of solder balls.

30. A method for producing a flip-chip ball grid array, comprising:
    coupling a die and a first set of solder balls;
    coupling a substrate and the first set of solder balls;
    coupling a second set of solder balls and the substrate;
    coupling a multi-layer printed circuit board heat dissipating metal and the thermal compound;
    coupling a backside of the die to the heat dissipating metal with thermal compound; and
    coupling thermal vias, of the multi-layer printed circuit board, and the second set of solder balls.

* * * * *